United States Patent [19]

Chang et al.

[11] Patent Number: 5,296,048

[45] Date of Patent: Mar. 22, 1994

[54] CLASS OF MAGNETIC MATERIALS FOR SOLID STATE DEVICES

[75] Inventors: Leroy L. Chang, Goldens Bridge; Leo Esaki, Katonah; Hiro Munekata, Mahopac; Hideo Ohno; Stephan vonMolnar, both of Ossining, all of N.Y.

[73] Assignee: International Business Machines Corporation, Yorktown Heights, N.Y.

[21] Appl. No.: 28,639

[22] Filed: Mar. 9, 1993

Related U.S. Application Data

[63] Continuation of Ser. No. 742,461, Aug. 5, 1991, abandoned, which is a continuation of Ser. No. 359,294, May 31, 1989, abandoned.

[51] Int. Cl.$^5$ .............................................. H01F 1/00
[52] U.S. Cl. ............................ 148/33; 252/62.3 GA; 252/62.3 E
[58] Field of Search .................. 148/33; 252/62.36 A, 252/62.51, 62.3 E

[56] References Cited

U.S. PATENT DOCUMENTS 4,193,835  3/1980  Inoue et al. ......................... 156/606
4,823,177  4/1989  Prinz et al. ............................ 357/27

FOREIGN PATENT DOCUMENTS 1238987  4/1967  Fed. Rep. of Germany .
89/10620  11/1989  PCT Int'l Appl. .

OTHER PUBLICATIONS

Kordos et al. "Preparation and Properties of Mn-Doped Epitaxial Gallium Arsenide", Solid State Electron, vol. 18, 1975, pp. 223–226.
Woodbury et al., ". . . Manganese-Doped Gallium Arsenide," Phys. Rev. B, vol. 8, No. 8, Oct. 15, 1973, pp. 3803–3810.
Maslov et al., "Nuclear Magnetic Resonance in Ion-Doped Gallium Arsenid," Sov. Phys. Solid State, vol. 17, No. 7, 1975, pp. 1418–1419.
Isaev-Ivanov et al., "Supermagnetism of Iron-Doped Gallium Arsenide", Sov. Phys. Solid State, vol. 16, No. 11, May 1975, pp. 2260–2261.
Isaev-Ivano et al., "Magnetic Interaction of Iron Atoms in the Gallium Arsenide Lattice," Sov. Phys. Solid State, vol. 14, No. 4, Oct. 1974, pp. 574–677.
Isaev-Ivanov et al., "Magnetic Properties of Iron-Doped Gallium Arsenide", Soviet Phys. Semiconductors, vol. 7, No. 2, Aug. 1973, pp. 299–300.
Illegems et al. Journal of Appl. Phys., vol. 46 No. 7, Jul. 1975 pp. 3059–3065 DeSimone et al. J. Appl. Phys. vol. 53(7), p. 4938, Jul. 1982.
DeSimone et al. J. Appl. Phys. vol. 53(7), p. 4938, Jul. 1982.
Asahi, et al. Japanese Journal of Appl. Phys., vol. 18, No. 3, Mar. 1979 pp. 565–573.
Frey, et al., Journal of Phys. C: Solid State Physics, vol. 21 (1988) pp. 5539–5545.

(List continued on next page.)

Primary Examiner—Robert Kunemund
Attorney, Agent, or Firm—Scully, Scott, Murphy & Presser

[57] ABSTRACT

A new semiconductor material or compound and method for its manufacture is disclosed. The material or compound has the Formula III-V or IV which includes as part of the compound, a transition element or a rare earth element present in an amount sufficient to change the material or compound from a paramagnetic state to a locally ordered magnetic state. The material or compound is made by depositing III, and V or IV and a transition element or a rare earth element onto a substrate at conditions such that the transition element or rare earth element that is deposited on the substrate is not in equilibrium with the material or compound. By employing this technique new semiconductor materials or compounds can be made including $Ga_{1-x}Mn_xAs$ and $In_{1-x}Mn$ As where Mn is present in an amount greater than about $5.4 \times 10^{20}$ cm$^{-3}$.

33 Claims, 1 Drawing Sheet

OTHER PUBLICATIONS

Rantien et al. Inst. Phys. Conf. Ser. No. 91: Chapter 3, Heraklion Greece 1987, pp. 239–242.

Sze, Semiconductor Devices–Physics and Technology, John Wiley & Sons, 1985 pp. 336–338.

T. Story et al. Phys. Rev. Let. vol. 56, No. 7 pp. 777–779 (1986).

Datta, et al., Superlattices and Microstructures, vol. 1 No. 4 pp. 327–334 (1985).

Copy of European Search Report and Annex dates Oct. 8, 1990 for EP 90 10 0486.

Isaev-Ivanov, et al., Inorganic Materials, 1975 II, pp. 1765–1766.

Munekata, et al., Physical Review Letters, vol. 63, No. 17, 1989, pp. 1849–1852.

DeSimone, et al., J. Appl. Phys., 53(7), 1982, pp. 4938–4942.

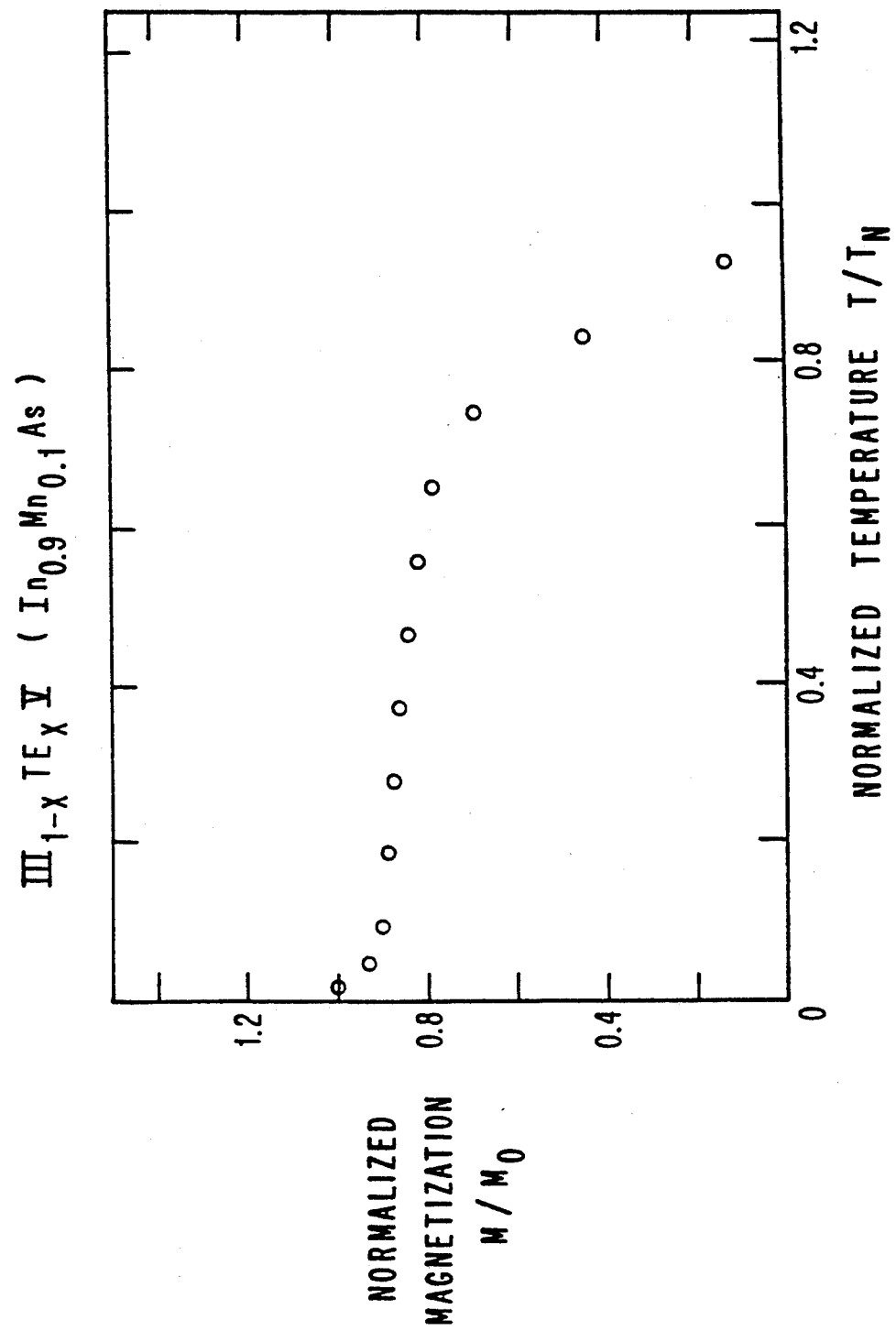

CLASS OF MAGNETIC MATERIALS FOR SOLID STATE DEVICES

This invention was made with government support under contract No. DAAL03-86-C-0004, awarded by the Department Of The Army. The government has certain rights in this invention.

This is a continuation of copending application Ser. No. 742,461 filed on Aug. 5, 1991, now abandoned, which is a continuation of Ser. No. 359,294 filed May 31, 1989, now abandoned.

TECHNICAL FIELD

The present invention relates to a new class of magnetic materials or compounds for solid state devices and a novel method for their fabrication. These new magnetic materials or compounds include diluted magnetic semiconductors (DMS) of the III-V type which have not been previously made. The prior art DMS materials are typically of the II-VI type.

PRIOR ART

An extensive discussion of DMS materials of the II-VI type is set forth in *Semiconductors and Semimetals*, Vol. 25 (subtitled) *Diluted Magnetic Semiconductors*, Academic Press, Inc., 1988. The II-VI DMS compounds are prepared by incorporating various transition metals into the crystal structure by methods known in the art.

Ilegems et al. Journal of Appl. Phys., Vol. 46, No. 7, July 1975, pp. 3059-3065 describe the manufacture of III-V compounds like gallium arsenide (GaAs) doped with transition metals such as manganese. Concentrations up to $10^{18}$ cm$^{-3}$ of manganese were achieved. The authors observed that there was no dependence of doping level on substrate temperature for substrate temperatures in the range from 560° to 600° C. Knudsen effusion calculations and measurements for molecular beam epitaxy (MBE) production of the compound indicated that manganese incorporation is arrival-rate controlled so that the amount of the doped manganese can be controlled by Knudsen cell temperature.

DeSimone et al. *J. Appl. Phys.* Vol. 53(7), p. 4938, July 1982 extended the work of Ilegems et al. and developed data that indicated that manganese both desorbs and accumulates on the growing surface in manganese doped GaAs layers, in competition with incorporation of manganese into the substrate. It was also observed that increasing substrate temperature increases this competition. Additionally arsenic and manganese also form a surface association-complex that reduces the mobility of manganese atoms thereby inhibiting desorbtion and incorporation and increasing the accumulated manganese on the surface. The diffusion was not found to be significant under the growth conditions employed e.g. utilizing a substrate temperature of from 500°-600° C. The maximum amount of manganese in the composition was about $10^{18}$ cm$^{-3}$.

Asahi et al., *Japanese Journal of Appl. Phys.*, Vol. 18, No. 3, March 1979, pp. 565-573 discloses a carrier concentration of manganese in indium gallium arsenide (InGaAs) that does not exceed $10^{18}$ cm$^{-3}$. A locally ordered magnetic state does not appear at such concentrations.

The authors describe the use of an indium phosphide (InP) substrate for the production of InGaAs epilayers. Because the InP substrate surface is easily damaged by maintaining it at high temperature, for example at 500° C., the substrate is maintained at around 420° C. until several hundred angstroms of epilayer are grown after which it is raised to 520° C. Doping the InGaAs epilayer at the lower temperatures is not disclosed. The Knudsen effusion data correlate with those of Ilegems et al.

This reference contains a detailed description of the production of such materials by MBE wherein the different elements used in the production of the compound are in separate furnaces or cells i.e. they are not mixed prior to MBE deposition.

Frey et al., *Journal of Phys. C: Solid State Physics*, Vol. 21( (1988) pp. 5539-5545. discloses doping gallium arsenide with manganese to a level of $5.1 \times 10^{18}$ cm$^{-3}$. These doping levels do not produce a locally ordered magnetic state.

Rantien et al., *Inst. Phys. Conf. Ser. No. 91*: Chapter 3, Heraklion Greece, 1987, pp. 239-242 do not indicate any specific doping levels of manganese in AlGaAs it appearing from other measurements that the amount of manganese present in this material is insufficient to produce a locally ordered magnetic state. The authors utilize photoluminescence measurements to study the compound.

Prinz et al. U.S. Pat. No. 4,823,177 discuss diluted magnetic semiconductor materials none of which are III-V compounds but of the II-VI type. These compounds are grown on a gallium arsenide substrate and contain chromium, manganese, iron, cobalt and nickel.

OBJECTS OF THE INVENTION

It is an object of the present invention to provide a new class of magnetic materials for solid state devices and a method for manufacturing such materials.

It is also an object of the present invention to provide a new class of materials or compounds which exhibit desirable magnetic phase transitions and are compatible with conventional semiconductors.

It is a further object of the present invention to provide a semiconductor compound of the Formula III-V that can function as a DMS compound as well as methods for manufacturing such compound.

It is a further object of the present invention to provide novel materials or compounds that are suitable for magneto-optic and magneto-electronic devices, particularly for integrated applications.

It is a further object of the present invention to provide a material or compound that shows strong magnetic ordering including such compounds that undergo a sharp transition from paramagnetic to ferromagnetic.

It is also an object of the present invention to provide a novel material or compound that will go from a paramagnetic state to a locally ordered magnetic state.

It is also an object of the invention to provide a material or compound that will exhibit the properties as stated above in the "Objects of the Invention" substantially at room temperature and slightly above room temperature.

These and other objects have been achieved by the present invention which is set forth in the specification and claims that follow and the attached drawing.

BRIEF DESCRIPTION OF THE DRAWINGS

FIG. 1 comprises a plot of normalized magnetization versus normalized temperature for one of the novel compounds of the present invention $III_{1-x}TE_xV(In_{0.9}Mn_{0.1}As)$.

FIG. 2 comprises a plot of normalized magnetization versus normalized temperature for ferromagnetic InMnAs grown by MBE at a substrate temperature of 300° C. (curve "A") and a diluted magnetic semiconductor (DMS) substance comprising InMnAs grown by MBE at a substrate temperature of 200° C. (curve "B"). The concentration of Mn in both InMnAs substances was in excess of about $10^{20} cm^{-3}$.

DESCRIPTION OF THE INVENTION

DMS materials and their application are known in the art and are sometimes referred to as semimagnetic semiconductors. These prior art compositions generally are mixed semiconducting crystals in which magnetic ions such as $Mn^{2+}$ are incorporated in substitutional positions of a II-VI crystal lattice.

DMS materials have memory and storage functions in that they can be employed in magneto-optical writing/reading and further exhibit both magnetic ordering and electronic conduction which enables them to be used as field-induced magnetic and electronic switches.

Successful DMS III-V compounds have not been produced, most likely because of the difficulties encountered in placing significant quantities of elements into the III-V materials that would impart magnetic properties to it. DeSimone et al. (supra) describes some of the problems in the incorporation of manganese into gallium arsenide layers in this respect in that arsenic and manganese form a surface association complex that reduces the mobility of manganese atoms which in turn inhibits desorption and incorporation of manganese and further increases the accumulation of manganese on the growing surface.

The elements commonly employed to impart magnetic properties to DMS materials of the II-VI type are the transition elements. Materials such as manganese combined with III-V compounds have not been incorporated into these compounds in amounts greater then $10^{18} cm^{-3}$. At this level, the transition element is considered more as a "dopant" than anything else.

The present invention comprises a novel class of magnetic materials or compounds for solid state devices and a method for making such materials. The materials or compounds of the present invention comprise materials or compounds of the Formula III-V or IV including as a part of the material or compound any of the transition elements or any of the rare earth elements in an amount sufficient to change the material or compound from a paramagnetic state to a locally ordered magnetic state where in the Formula III-V or IV:

(a) III is any element or mixture of elements of the Group IIIA elements of the Periodic Table of the Elements i.e. boron, aluminum, gallium, indium and thallium, especially aluminum, gallium and indium;

(b) V is any element or mixture of elements of Group VA of the Periodic Table of the Elements including nitrogen, phosphorous, arsenic, antimony and bismuth, especially phosphorous, arsenic and antimony;

(c) IV is an elemental semiconductor and is at least one element of Group IVA of the Periodic Table of the Elements The transition elements are those elements in which the outer electron shell consisting of eight electrons can be interrupted so that the penultimate electron shell can go from 8 to 18 or 32 electrons.

The rare earth elements are the so called lanthanides and include elements 57-71.

The preferred transition elements comprise those in Groups VB, VIB, VIIB and VIII of the Periodic Table of the Elements such as those in the Fourth Period of the aforementioned Groups, especially chromium, manganese, iron, cobalt and nickel.

The transition element or the rare earth element, as noted before is present in an amount sufficient so that the novel material or compound can be changed from a paramagnetic state to a locally ordered magnetic state such as a ferromagnetic state, ferrimagnetic state; (e.g. where a mixture of transition elements are employed) spin glass or antiferromagnetic states. Any one of the novel materials or compounds of the present invention may have a variety of the aforesaid orders of magnetic states.

The data of FIG. 1 were obtained by the measurement of the ferromagnetic state- of the material described therein, FIG. 1, as noted before being the plot of normalized magnetization against normalized temperature.

In another embodiment, the amount of the transition element in the novel material or compound is greater than about $10^{20} cm^{-3}$ and especially from greater than about $10^{20} cm^{-3}$ to about $10^{22} cm^{-3}$.

The novel materials or compounds of the present invention are especially significant DMS materials since the change from the paramagnetic to a locally ordered magnetic state takes place over a range of temperatures up to slightly above room temperature especially from about 1° K. to about 350° K.

The materials or compounds of the present invention can be prepared based on the discovery that the various elements that typically are not very soluble in III-V materials, can be incorporated into such materials by employing strong non-equilibrium deposition or growth conditions in their synthesis. Equilibrium conditions inhibit the addition of transition elements such as manganese.

Non-equilibrium conditions are better understood in terms of the equilibrium of III-V materials in combination with transition elements. In DeSimone et al. (supra), a method is disclosed for the production of III-V materials or compounds such as GaAs in combination with manganese by an MBE process which resulted in the formation of a GaAs layer doped with manganese in an amount of about $10^{18} cm^{-3}$ and having on its surface a MnAs first layer, in equilibrium with and which prevented further manganese incorporation into the second layer, GaAs. This III-V system (the second layer) therefore can be considered to be in equilibrium with the transition element -Group V material (the first layer) and that at equilibrium the transition element is present as a dopant in the III-V layer in an amount of about $10^{18} cm^{-3}$. The prior art therefore established that, the equilibrium of the III-V system when combined with a transition element is achieved when the transition element is present in an amount of about $10^{18} cm^{-3}$. When the transition element is present in greater amounts, (i.e. orders of magnitude greater) the $III_{1-x}TE_xV$ material or compounds of the present invention are obtained which are considered to be meta- stable and the process conditions for producing these meta-stable materials or compounds are considered to be non-equilibrium conditions.

The preferred method for producing the materials or compounds of the invention comprises MBE, chemical vapor deposition (CVD) and ion implantation.

Although there are several methods by which non-equilibrium deposition or growth conditions can be introduced into the foregoing process for the manufacture of the novel materials or compounds of the present invention, the preferred method comprises reducing the temperature of the substrate e.g. the III-V substrate that the transition element is deposited on.

In the case of MBE production, one of the preferred methods to obtain non-equilibrium conditions is to reduce the temperature of the substrate to realize the non-equilibrium meta-stable conditions between the III-V compounds or materials and the transition element. As a result, the amount of transition element incorporated into the III-V materials or compounds can exceed the equilibrium concentration (about $10^{18}$ cm$^{-3}$). By employing the methods of the present invention this equilibrium concentration has been exceeded by orders of magnitude and concentrations of the transition element in the III-V materials or compounds of from greater than about $10^{20}$ cm$^{-3}$ to about $10^{22}$ cm$^{-3}$, and especially greater than about $5.4 \times 10^{20}$ cm$^{-3}$ to about $10^{22}$ cm$^{-3}$ have been achieved. By way of example, in the production of a $Ga_{1-x}Mn_xAs$ layer by MBE according to the present invention, the formation of MnAs on the surface of the layer is considerably reduced by lowering the substrate temperature on which the layer is formed.

Typically, the prior art methods employed substrate temperatures of from about 500° to about 600° C. According to the present invention, the deposition temperature of the substrate is from about 150° to about 450° C. and especially from about 150° to less than 400° C.

Non-equilibrium conditions can also be introduced into the foregoing method by decreasing the amount of time for the introduction of the transition element into the III-V material.

Non-equilibrium conditions are also established by maintaining the partial pressure ratio of the Group V element to the transition element in the process of the present invention at a level higher than that employed by the prior art methods.

Thus by reducing the substrate temperature, increasing the partial pressure ratio of Group V element to the transition element or reducing the time for deposition, strong non-equilibrium conditions can be maintained during the foregoing processes so that the transition element can be combined with the III-V material in quantities more than would be required to "dope" the III-V material i.e. quantities sufficiently high so that the resultant material or compound can go from a paramagnetic state to a locally ordered magnetic state.

It is also within the scope of the invention to vary any combination of temperature, partial pressures and time in order to achieve these results.

The term "compound" is meant to include those atomic or molecular elements of the invention that are bonded to one another by known chemical bonds such as co-valent bonds, coordinate co-valent bonds or ionic bonds. Typically, the compounds of the invention have crystalline structures.

The term "material" includes various mixtures of the elements with one another in which no chemical bond is formed between the elements. The term "material" includes mixtures of a "material" with a "compound."

The term "substance" is intended to include the "compound" and "material."

It has been generally found that at substrate temperatures in the range of about 150° C. to about 450° C. or about 150° C. to less than 400° C., the production of the compound is favored at the lower end of this range whereas production of the material is favored at the higher end of the range.

EXAMPLES

The following example illustrates the production of a III-V compound combined with a transition element in an amount greater then $10^{20}$ cm$^{-3}$. The example has been repeated several times and the results obtained were determined to be experimentally reproducible.

Preparation of $Ga_{1-x}Mn_xAs$

An MBE apparatus having separate effusion cells for Ga, Mn and As was employed. The cells were pointed at a substrate. Each cell had an individually controllable shutter interposed between the opening of the cell and the substrate which comprised GaAs (100). The temperature of the substrate was adjusted to between 200°–450° C. and prior to deposition, the beam ratio was calibrated by an ion gauge. The manganese (950° C.) beam intensity was adjusted to $4 \times 10^{-9}$ Torr, the gallium (998° C.) beam intensity to $8.5 \times 10^{-9}$ Torr. and the arsenic (230° C.) beam intensity to $4 \times 10^{-7}$ Torr. A net growth rate of 200 angstroms per minute was sustained to obtain a $Ga_{0.9}Mn_{0.1}As$ compound having a total film thickness of about 2.5 microns.

The film was analyzed by electron microprobe analysis to measure the ratios of Ga/Mn/As.

The film was also analyzed by electron diffraction to evaluate the crystal perfection on the top surface of the film after the film developed to a 2.5 micron thickness. The electron diffraction measurements indicated that no crystal degredation occurred and accordingly it was concluded that there was no equilibrium of the manganese with the gallium and arsenic in the film and that the process employed was successful in sustaining the concentration of manganese which was determined to be greater than about $10^{20}$ cm$^{-3}$.

Initial measurements of the material thus produced established that it has an expected crystal structure and evidence of a fundamental light-absorption edge (band gap measurements) which indicate semiconductor properties.

The magnetization data for the GaMnAs film (Ga/Mn/As=0.9/0.1/1.0) deposited at 400° C. show a magnetic phase transition from a locally ordered magnetic state to a paramagnetic state at about 310° K.

For these reasons, the novel materials or compounds of the present invention can be utilized in magneto-optical writing/reading (Faraday effect or Kerr effect) applications They also evidence magnetic ordering and electronic conduction (magneto-transport effect) which enables them to be used in field-induced magnetic and electronic switching applications.

Preparation of $In_{1-x}Mn_xAs$

Another example is InMnAs, which is deposited on both GaAs(100) and InAs(100) substrates at 150°–300° C. by MBE. From the in-situ observation of reflection high energy electron diffraction (RHEED), there is no noticeable indication of phase separation nor formation of the three dimensionally nucleated islands in the entire process of the epitaxial growth within the range of the average composition of In/Mn/As=0.9/0.1/1.0. The growth is initiated by a $(1 \times 1)$ elemental streak pattern, followed by a gradual rearrangement in surface reconstruction with a $2 \times 1$ pattern which lasts even after the deposition of 2-μm thick films. A thin InMnAs film thus prepared shows a mirror like surface, and there is no obvious signature of natural oxidation at atmospheric conditions Magnetic contribution of Mn appears to be fairly strong in the material. The film with the composition of In/Mn/As=0.97/0.03/1.0 deposited at a substrate temperature of 300° C. exhibits magnetic order and undergoes a transition from ferromagnetism to paramagnetism near 300K, implying MnAs-like behavior of Mn in the material. The films are conductive yet behavior is puzzling; the sign of the Hall coefficient is hole-like at 77K, whereas it is converted to be electron-like at RT. Another important feature is the compatibility to the host semiconductors. Epitaxial growth of InAs on top of In MnAs was also obtained by MBE; in this case the RHEED pattern of the InAs epi-layer retains the same pattern of (2×1) as that of the InMnAs layer. A multi-layer structure of twenty-four alternating layers of InAs(150nm)-InMnAs(150nm) was fabricated with similar ferromagnetic characteristics as observed in a single InMnAs layer.

The magnetization behavior for the InMnAs film (In/Mn/As =0.9/0.1/1.0) deposited at a substrate temperature of 200° C. follows a Curie-Weiss law as typically observed for diluted magnetic semiconductors.

The difference between InMnAs substances deposited by MBE on a substrate at a temperature of either 300° C. or 200° C. as described above, can be readily seen by reference to FIG. 2 in which the normalized magnetization is plotted against normalized temperature for the substances, curve "B" illustrating the characteristics of DMS InMnAs material grown at a substrate temperature of 200° C. whereas curve "A" illustrates this plot for a ferromagnetic InMnAs substance grown at 300° C. In either event, the concentration of Mn in either the aforesaid ferromagnetic or DMS substances is in excess of $10^{20}cm^{-3}$.

The same methods can be employed for introducing the rare earth elements into III-V materials and similarly, Group IV semiconductor materials may be combined with the aforesaid transition elements or rare earth elements especially the aforesaid transition elements.

In the materials or the compounds of the present invention various combinations of III-V or IV compounds, transition elements or rare earth elements may be produced.

The various combinations of the Group III elements in the Formula III-V preferably comprises up to three combinations of Group III elements and similarly for each of the Group V elements. Two or more Group IV elements may be used in this respect and similarly combinations of up to three transition and/or rare earth elements can be used. Stated otherwise where combinations of elements are employed in the material or compound of the present invention the combinations of up to three elements is especially preferred. By way of example and not limitation, in the material or compound of the Formula III-V there may comprise anywhere from 1 to about 3 Group III elements, 1 to about 3 Group V elements, 0 to about 3 transition elements and 0 to about 3 rare earth elements with the proviso that at least one transition element or one rare earth element is present in the combination Similarly, where combinations of elements are employed for the Group IV material or compound, by way of example, anywhere from 2 to about 3 Group IV elements may be employed in combination with from 0 to about 3 transition elements and from 0 to about 3 rare earth elements, again with the proviso that at least one transition element or one rare earth element is also present in the material or compound By employing the MBE process as set forth in the Examples, in which the MBE apparatus has individual cells in which the various elements to be deposited are contained and each of the cells are controlled by a shutter that allows the molecular beam from the cell to impact against the substrate when the shutter is open and to prevent the molecular beam from impacting against the substrate when the shutter is closed, various deposition techniques can be employed such as by simultaneously bombarding the substrate with all of the elements that are to be incorporated into the material or compound or by sequentially opening and closing the shutters so that the material or compound that is formed according to the invention is built up in sequences of elements or combinations of elements. For example the transition element (e.g. manganese) may be deposited on the substrate followed by the Group V element and then the Group III element with the Group V element, either for prolonged periods of time or in short bursts. Any combination of sequences in this regard may be employed in order to promote the combination of the transition element (or rare earth element) with the III-V material or compound or the IV material or compound.

The CVD or ion implantation method may be similarly carried out whereby the material or compound of the present invention is prepared by simultaneous or sequential combination of the elements employed in their manufacture.

Examples of various materials or compounds according to the present invention that may be made in which combinations of elements are employed are as follows:

1. Transition Metals with Binary III-V Compounds
   Gallium-Manganese-Arsenide (GaMnAs), Indium Manganese Arsenide (InMnAs); Indium-Manganese-Antimonide (InMnSb), Indium-Iron-Arsenide (InFeAs), Gallium-Chromium-Antimonide (GaCrSb).
2. Transition Metals with Ternary III-V Compounds
   Gallium-Indium-Manganese-Arsenide (GaInMnAs), Gallium-Aluminum-Manganese-Antimonide (GaAlMnSb), Indium-Manganese-Arsenide-Antimonide (InMnAsSb), Gallium-Chromium-Arsenide-Antimonide (GaCrAsSb).
3. Transition metals with Quaternary III-V Compounds
   Gallium-Indium-Manganese-Arsenide-Phosphide (GaInMnAsP), Gallium-Aluminum-Indium-Manganese-Antimonide (GaAlInMnSb).

Although the invention has been described by reference to some embodiments, it is not intended that the novel materials or compounds described herein or the novel method of manufacturing them be limited thereby but that certain modifications thereof are intended to be included as falling within the broad scope and spirit of the foregoing disclosure, the attached drawing and the following claims.

Having thus described our invention, what we claim as new and desire to secure by Letters Patent is:

1. A crystalline substance of the formula III-V including as a part of said substance at least one of a transition element or a rare earth element present in an amount at least about $5.4 \times 10^{20} cm^{-3}$ to change said substance from a paramagnetic state to a locally ordered magnetic state where in said formula III-V:
   (a) III is at least one element of Group IIIA; and
   (b) V is at least one element of Group VA.

2. A crystalline substance of the formula III-V including as part of said substance a transition element present in an amount at least about $5.4 \times 10^{20} cm^{-3}$ to change said substance from a paramagnetic state to a locally ordered magnetic state where in said formula III-V:
(a) III is at least one element of Group IIIA and
(b) V is at least one element of Group VA.

3. The crystalline substance of claim 2 where said transition element is present in an amount sufficient to change said substance from a paramagnetic state to a locally ordered magnetic state up to about room temperature.

4. The crystalline substance of claim 2 where said transition element is present in an amount sufficient to change said substance from a paramagnetic state to a locally ordered magnetic state at a temperature from about 1° K. to about 350° K.

5. A crystalline substance of the formula:

$$III_{1-x}TE_xV$$

wherein:
(a) III is at least one element of Group IIIA;
(b) TE is a transition element;
(c) V is at least one element of Group VA and the value of x is such that the amount of TE in said substance is at least about $5.4 \times 10^{20}$ cm$^{-3}$.

6. The crystalline substance of any of claims 2-4 wherein said transition element is at least one of the elements of the Fourth Period of the Periodic Table of the Elements.

7. The substance of any of claims 2-4 wherein transition element is at least one of V, Cr, Mn, Fe, Co or Ni.

8. The crystalline substance of any of claims 2-4 wherein III is at least one of Ga, In or Al and wherein V is at least one of P, As or Sb and said transition element is at least one of Cr, Mn, Fe, Co or Ni.

9. The crystalline substance of claim 8 wherein said transition element is present in an amount from greater then about $5.4 \times 10^{20}$ cm$^{-3}$ to about $5.4 \times 10^{22}$ cm$^{-3}$.

10. The crystalline substance of claim 5 of the formula:

$$Ga_{1-x}Mn_xAs.$$

11. The crystalline substance of claim 5 of the formula:

$$In_{1-x}Mn_xAs.$$

12. The crystalline substance of any of claims 5, 10 and 11 where said substance is a compound.

13. The crystalline substance of any of claims 5, 10 or 11 where said substance is a material.

14. A crystalline substance of the formula III-V including as a part of said substance at least one of a transition element or rare earth element present in an amount at least about $5.4 \times 10^{20}$ cm$^{-3}$ to change said substance to a locally ordered magnetic state where in said formula III-V:
(a) III is at least one element of Group IIIA; and
(b) V is at least one element of Group VA.

15. A crystalline substance of the formula III-V including as part of said substance a transition element present in an amount at least about $5.4 \times 10^{20}$cm$^{-3}$ sufficient to change said substance to a locally ordered magnetic state where in said formula III-V:
(a) III is at least one element of Group IIIA and
(b) V is at least one element of Group VA.

16. The single crystalline substance of claim 15 where said transition element is present in an amount sufficient to change said substance to a locally ordered magnetic state up to about room temperature.

17. The crystalline substance of claim 15 where said transition element is present in an amount sufficient to change said substance to a locally ordered magnetic state at a temperature from about 1° K. to about 350° K.

18. The crystalline substance of any of claims 15 to 17 wherein said transition element is at least one of the elements of the Fourth Period of the Periodic Table of the Elements.

19. The crystalline substance of any one of claims 15 to 17 wherein said transition element is at least one of V, Cr, Mn, Fe, Co or Ni.

20. The crystalline substance of any of claims 15 to 17 wherein III is at least one of Ga, In or Al and wherein V is at least one of P, As or Sb and said transition element is at least one of Cr, Mn, Fe, Co or Ni.

21. The crystalline substance of claim 16 wherein said transition element is present in an amount from at least about $5.4 \times 10^{20}$cm$^{-3}$ to about $10^{22}$cm$^{-3}$.

22. The substance of claim 5 wherein said transition element is at least one of the elements of the Fourth Period of the Periodic Table of the Elements.

23. The substance of claim 5 wherein said transition element is at least one of V, Cr, Mn, Fe, Co or Ni.

24. The substance of claim 5 wherein III is at least one of Ga, In or Al and wherein V is at least one of P, As or Sb and said transition element is at least one of Cr, Mn, Fe, Co or Ni.

25. The substance of claim 24 wherein said transition element is present in an amount from at least about $5.4 \times 10^{20}$ cm$^{-3}$ to about $10^{22}$cm$^{-3}$.

26. The substance of any one of claims 5, 10, 11 or 22-25 which is a diluted magnetic semiconductor.

27. A crystalline substance of the formula IV including as a part of said substance at least one of a transition element or rare earth element present in an amount at least about $10^{29}$ cm$^{-3}$ to change said substance to a locally ordered magnetic state where, in said formula, IV is an elemental semiconductor from at least one element of Group IVA.

28. The crystalline substance of claim 27 where said transition element is present in an amount sufficient to change said substance to a locally ordered magnetic state up to about room temperature.

29. The crystalline substance of claim 27 where said transition element is present in an amount sufficient to change said substance to a locally ordered magnetic state at a temperature from about 1° K. to about 350° K.

30. The crystalline substance of any of claims 27-29, wherein said transition element is at least one of the elements of the Fourth Period of the Periodic Table of Elements.

31. The crystalline substance of any one of claims 27-29 wherein said transition element is at least one of V, Cr, Mn, Fe, Co or Ni.

32. The crystalline substance of claim 30 which is a diluted magnetic semiconductor.

33. The crystalline substance of claim 31 which is a diluted magnetic semiconductor.

* * * * *

UNITED STATES PATENT AND TRADEMARK OFFICE
CERTIFICATE OF CORRECTION

PATENT NO. : 5,296,048

DATED : March 22, 1994

INVENTOR(S) : Leroy Li-Gong Chang, et al.

Page 1 of 2

It is certified that error appears in the above-indentified patent and that said Letters Patent is hereby corrected as shown below:

On the Title Page, Section [56], under "OTHER PUBLICATIONS", line 8: "Arsenid" should read --Arsenide--

Item [57] Abstract, line 15, "Mn" (1st occurrence) should read --$Mn_x$--

Column 2, line 14: after "5545" delete --.--

Column 4, line 17: "state- of" should read --state of--

Column 6, line 42: "light-" should read --light--

Column 6, line 52: after "applications" insert --.--

Column 7, line 4: after "conditions" insert --.--

Column 9, line 33, Claim 7: after "The" insert --crystalline

Column 9, line 54, Claim 12: "and" should read --or--

UNITED STATES PATENT AND TRADEMARK OFFICE
CERTIFICATE OF CORRECTION

PATENT NO. : 5,296,048
DATED : March 22, 1994
INVENTOR(S) : Leroy Li-Gong Chang, et al.

It is certified that error appears in the above-indentified patent and that said Letters Patent is hereby corrected as shown below:

Column 10, line 44, Claim 27: "$10^{29}$" should read --$10^{20}$--

Signed and Sealed this

Sixth Day of June, 1995

Attest:

BRUCE LEHMAN

Attesting Officer

Commissioner of Patents and Trademarks